(12) United States Patent
Baba et al.

(10) Patent No.: US 11,582,861 B2
(45) Date of Patent: Feb. 14, 2023

(54) ELECTRONIC DEVICE

(71) Applicant: Murata Manufacturing Co., Ltd., Nagaokakyo (JP)

(72) Inventors: Takahiro Baba, Nagaokakyo (JP); Kosuke Nishino, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 320 days.

(21) Appl. No.: 16/439,736

(22) Filed: Jun. 13, 2019

(65) Prior Publication Data

US 2019/0297722 A1  Sep. 26, 2019

Related U.S. Application Data

(63) Continuation of application No. PCT/JP2018/005016, filed on Feb. 14, 2018.

(30) Foreign Application Priority Data

Feb. 20, 2017 (JP) .............................. JP2017-028805

(51) Int. Cl.
*H05K 1/02* (2006.01)
*H01P 3/08* (2006.01)
(Continued)

(52) U.S. Cl.
CPC ............. *H05K 1/0243* (2013.01); *H01P 3/08* (2013.01); *H05K 1/024* (2013.01); *H05K 1/0224* (2013.01);
(Continued)

(58) Field of Classification Search
CPC .......... H05K 1/0243; H05K 1/14; H05K 1/11; H05K 3/46; H05K 1/18; H05K 1/0224;
(Continued)

(56) References Cited

U.S. PATENT DOCUMENTS

| 5,290,971 A | 3/1994 | Hamaguchi et al. |
| 5,514,475 A | 5/1996 | Nawa et al. |

(Continued)

FOREIGN PATENT DOCUMENTS

| JP | 04-229691 A | 8/1992 |
| JP | 06-224525 A | 8/1994 |

(Continued)

OTHER PUBLICATIONS

Official Communication issued in International Patent Application No. PCT/JP2018/005016, dated May 15, 2018.

*Primary Examiner* — Andargie M Aychillhum

(74) *Attorney, Agent, or Firm* — Keating & Bennett, LLP

(57) ABSTRACT

An electronic device includes a circuit board and an electric element mounted on the circuit board. The electric element includes a multilayer body made of electrically insulating base materials, a transmission line portion, and connection portions. The transmission line portion and the connection portions are provided in the multilayer body. Each of the connection portions is continuous with a corresponding portion of the transmission line portion, and is connected to the circuit board by an electrically conductive bonding material. The transmission line portion other than the connection portions is not electrically connected to an electronic component on the circuit board. The electronic component not electrically connected to the electric element is disposed between the transmission line portion of the electric element and the circuit board.

19 Claims, 13 Drawing Sheets

(51) Int. Cl.
*H05K 1/14* (2006.01)
*H05K 1/18* (2006.01)
*H05K 1/11* (2006.01)
*H05K 3/46* (2006.01)

(52) U.S. Cl.
CPC .................. *H05K 1/11* (2013.01); *H05K 1/14* (2013.01); *H05K 1/141* (2013.01); *H05K 1/18* (2013.01); *H05K 1/181* (2013.01); *H05K 3/46* (2013.01); *H05K 2201/1006* (2013.01); *H05K 2201/10515* (2013.01)

(58) Field of Classification Search
CPC ........ H05K 1/024; H05K 1/141; H05K 1/181; H05K 2201/1006; H05K 2201/10515; H05K 1/0231; H05K 2201/042; H05K 1/0245; H01P 3/08; H01P 1/2135; H01P 3/085
USPC ......................................................... 361/760
See application file for complete search history.

(56) References Cited

U.S. PATENT DOCUMENTS

| | | | | |
|---|---|---|---|---|
| 5,982,249 A | * | 11/1999 | Bruns | ................... H01P 3/081 174/253 |
| 7,656,677 B2 | * | 2/2010 | Ogawa | ................ H01L 23/5383 174/260 |
| 10,340,572 B2 | * | 7/2019 | Oguri | ..................... H05K 1/028 |
| 2002/0008599 A1 | * | 1/2002 | Sridharan | ............. H01P 11/003 333/128 |
| 2006/0141854 A1 | * | 6/2006 | Gushiken | ............... H01R 13/03 439/495 |
| 2010/0084169 A1 | * | 4/2010 | Nakamura | ............. H05K 1/028 174/254 |
| 2014/0048312 A1 | * | 2/2014 | Kato | .................... H05K 1/0298 174/251 |
| 2014/0292449 A1 | * | 10/2014 | Kato | ....................... H01P 3/085 333/238 |
| 2015/0289368 A1 | * | 10/2015 | Daghighian | ......... H05K 3/4688 174/255 |
| 2017/0033426 A1 | | 2/2017 | Baba et al. | |
| 2018/0151951 A1 | * | 5/2018 | Ikemoto | ................ H05K 1/181 |
| 2019/0320531 A1 | * | 10/2019 | Yasuda | ............... H01L 23/5384 |
| 2020/0227806 A1 | * | 7/2020 | Baba | .................... H05K 1/0239 |

FOREIGN PATENT DOCUMENTS

| | | | |
|---|---|---|---|
| JP | 07-283498 A | | 10/1995 |
| JP | 2005-011927 A | | 1/2005 |
| JP | 2006-179821 A | | 7/2006 |
| JP | 2011-165931 A | | 8/2011 |
| JP | 2011165931 | * | 8/2011 |
| JP | 2016-213310 A | | 12/2016 |
| WO | 2016/088592 A1 | | 6/2016 |

* cited by examiner

ELECTRONIC DEVICE

CROSS REFERENCE TO RELATED APPLICATIONS

This application claims the benefit of priority to Japanese Patent Application No. 2017-028805 filed on Feb. 20, 2017 and is a Continuation Application of PCT Application No. PCT/JP2018/005016 filed on Feb. 14, 2018. The entire contents of each application are hereby incorporated herein by reference.

BACKGROUND OF THE INVENTION

1. Field of the Invention

The present invention relates to an electronic device including a circuit board and an electric element mounted on the circuit board.

2. Description of the Related Art

A cable-shaped transmission line made up of a flexible multilayer board is described in International Publication No. 2016/088592 as a transmission line for connecting a radio-frequency circuit or a radio-frequency element to another radio-frequency circuit or radio-frequency element. The transmission line as well as other electronic components is configured to be surface-mountable on a circuit board.

When the transmission line is formed in a thin sheet shape, the dimension of the transmission line in a thickness direction is reduced, so the transmission line can be disposed in a narrow gap inside a casing of a small electronic device.

However, to surface-mount the transmission line on a circuit board, mounting space for disposing the transmission line, of course, needs to be ensured on the circuit board. For this reason, for a small electronic device, the footprint of the transmission line becomes a problem in some cases. In addition, when the transmission line is mounted together with many electronic components in a limited space on a circuit board, the transmission line can be unusable when the transmission line cannot be mounted around the locations at which other electronic components are disposed.

When the width of a transmission line is narrowed to reduce the footprint of the transmission line, the area of ground conductor patterns that sandwich a signal line reduces. For this reason, an electromagnetic interference (EMI) problem easily occurs between the transmission line and another electronic component laterally close to the transmission line.

SUMMARY OF THE INVENTION

Preferred embodiments of the present invention provide electronic devices each including a structure of mounting a transmission line that has a high degree of freedom of mounting a transmission line on a circuit board, and thus has a substantially reduced footprint of a transmission line, or does not interfere with disposition of another electronic component. Preferred embodiments of the present invention also provide electronic devices that each removes an EMI problem between a transmission line and another electronic component that are mounted on a circuit board.

According to a preferred embodiment of the present invention, an electronic device includes a circuit board, an electronic component mounted on the circuit board, and an electric element surface-mounted on the circuit board. The electric element includes a multilayer body, a transmission line portion, and a plurality of connection portions. The multilayer body includes a plurality of laminated electrically insulating base materials that are the same material. The transmission line portion and the plurality of connection portions are provided in the multilayer body. Each of the plurality of connection portions is continuous with a corresponding one of a plurality of portions of the transmission line portion. The multilayer body includes first portions and a second portion. A number of the laminated electrically insulating base materials at each of the first portions is greater than a number of the laminated electrically insulating base materials at the second portion. The first portions are projecting portions, and the second portion is a recessed portion. Each of the plurality of connection portions is provided at a corresponding one of the projecting portions. Each of the plurality of connection portions is connected to the circuit board by an electrically conductive bonding material. The electric element is surface-mounted on the circuit board in a positional relationship that the recessed portion faces the electronic component.

With the above configuration, since the electronic component is disposed between the transmission line portion and the circuit board, a region under the transmission line portion is also effectively used. That is, the electric element, where necessary, can straddle another electronic component, so the substantial footprint of the electric element is reduced without narrowing the width of the electric element more than necessary.

Preferably, the plurality of connection portions includes a first connection portion, a second connection portion, and a third connection portion, the electric element has a longitudinal direction, and the first connection portion and the second connection portion are respectively provided at both ends in the longitudinal direction, and the third connection portion is provided between the first connection portion and the second connection portion in the longitudinal direction. With this configuration, the distance between the adjacent connection portions reduces, and thus, even when the distance from the first connection portion to the second connection portion increases, the mechanical strength of the electric element on the circuit board is ensured.

Preferably, the transmission line portion includes a plurality of signal lines including a first signal line and a second signal line, a first end of the first signal line is provided at the first connection portion, a second end of the first signal line is provided at the second connection portion, a first end of the second signal line is provided at the first connection portion, and a second end of the second signal line is provided at the third connection portion. With this configuration, the electric element can be handled as a single component including the first transmission line continuous between the first connection portion and the second connection portion and the second transmission line continuous between the first connection portion and the third connection portion.

Preferably, the transmission line portion includes a signal line including a first end, a second end, and a third end, the first end of the signal line is provided at the first connection portion, the second end of the signal line is provided at the second connection portion, and the third end of the signal line is provided at the third connection portion. With this configuration, the transmission line whose one end is connected to the first connection portion is branched to be continuous with the second connection portion and the third connection portion. Thus, the electric element is usable as a power splitter or a multiplexer-demultiplexer.

Preferably, the transmission line portion includes a lower ground conductor pattern parallel to the circuit board, and the lower ground conductor pattern is located between the signal line and the electronic component. With this structure, the lower ground conductor pattern is interposed between the signal line and another electronic component mounted on the circuit board, so an EMI problem of the electric element on the circuit board side is avoided.

Preferably, the transmission line portion further includes an upper ground conductor pattern located such that the signal line is interposed between the upper ground conductor pattern and the lower ground conductor pattern. With this structure, even when another electric element or another electronic component is disposed on or above the electric element, the upper ground conductor pattern is interposed between the signal line and another electric element or electronic component disposed above, so an EMI problem on the upper side of the electric element is also avoided.

Preferably, in a plan view of the circuit board, the transmission line portion is narrower in width than the plurality of connection portions. With this configuration, while the connection strength of the electric element to the circuit board is ensured, the footprint on the circuit board is reduced, so the flexibility of disposition of an electronic component on the circuit board increases.

In a plan view of the circuit board, the electric element may have a curved or bent shape so as to be routed around the electronic component. With this structure, even when an electronic component having a relatively high profile is located close to the electric element and no sufficient space is ensured in a height direction between the transmission line portion of the electric element and the circuit board, the electric element can be mounted on the circuit board around the electronic component having a high profile.

Preferably, when a plurality of electronic components having different profiles are mounted on the circuit board, of the plurality of electronic components, an electronic component that the recessed portion of the electric element faces is an electronic component other than an electronic component having the highest profile among the plurality of electronic components. With this structure, the electric element straddling the electronic component does not become extremely high, so effective use of space is achieved.

Preferably, the circuit board includes an electrically insulating portion, and the laminated electrically insulating base materials are lower in permittivity than the electrically insulating portion of the circuit board. Thus, the width and thickness of the signal line of the transmission line portion are greater than those of a transmission line defined by the conductor pattern at the circuit board and having the same characteristic impedance as that of the transmission line portion, so a conductor loss is reduced. In addition, a dielectric loss is also reduced. Furthermore, since the gap between the signal line and a ground conductor pattern is narrowed, an entirety of the electric element has a low profile.

Preferred embodiments of the present invention increase a degree of freedom of mounting a transmission line on a circuit board. This allows providing a transmission line that has a substantially reduced footprint of a transmission line, and does not interfere with disposition of another electronic component. Preferred embodiments of the present invention also remove an EMI problem between a transmission line and another electronic component that are mounted on a circuit board. Thus, a small electronic device is easily provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
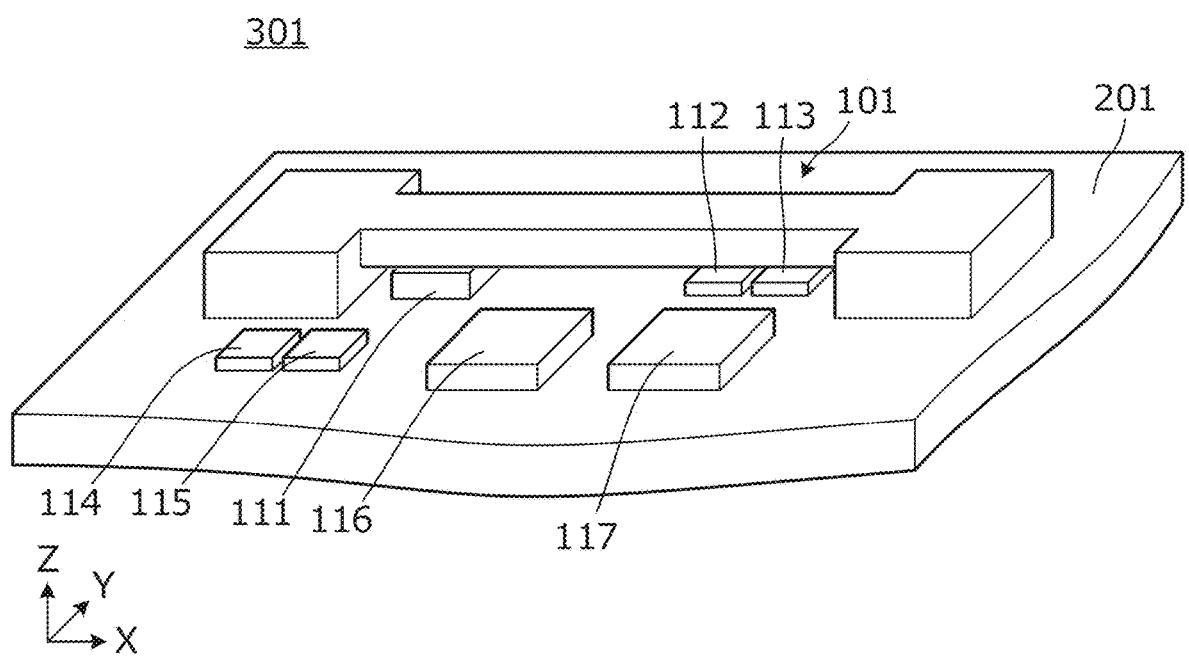
FIG. 1 is a perspective view of a main portion of an electronic device according to a first preferred embodiment of the present invention.

Hereinafter, a plurality of preferred embodiments of the present invention will be described with reference to the drawings by way of some specific examples. The same reference signs denote the same portions in the drawings. In consideration of description of main points or easy understanding, description will be made in a plurality of preferred embodiments for the sake of convenience; however, components described in the different preferred embodiments may be partially replaced or combined. In the description of the preferred embodiments, overlapping or repetitive description relating to common matters is omitted, and different points will be specifically described. Similar operation and advantageous effects obtained by similar components will not be referred to one by one for each preferred embodiment.

First Preferred Embodiment

Figure 2:
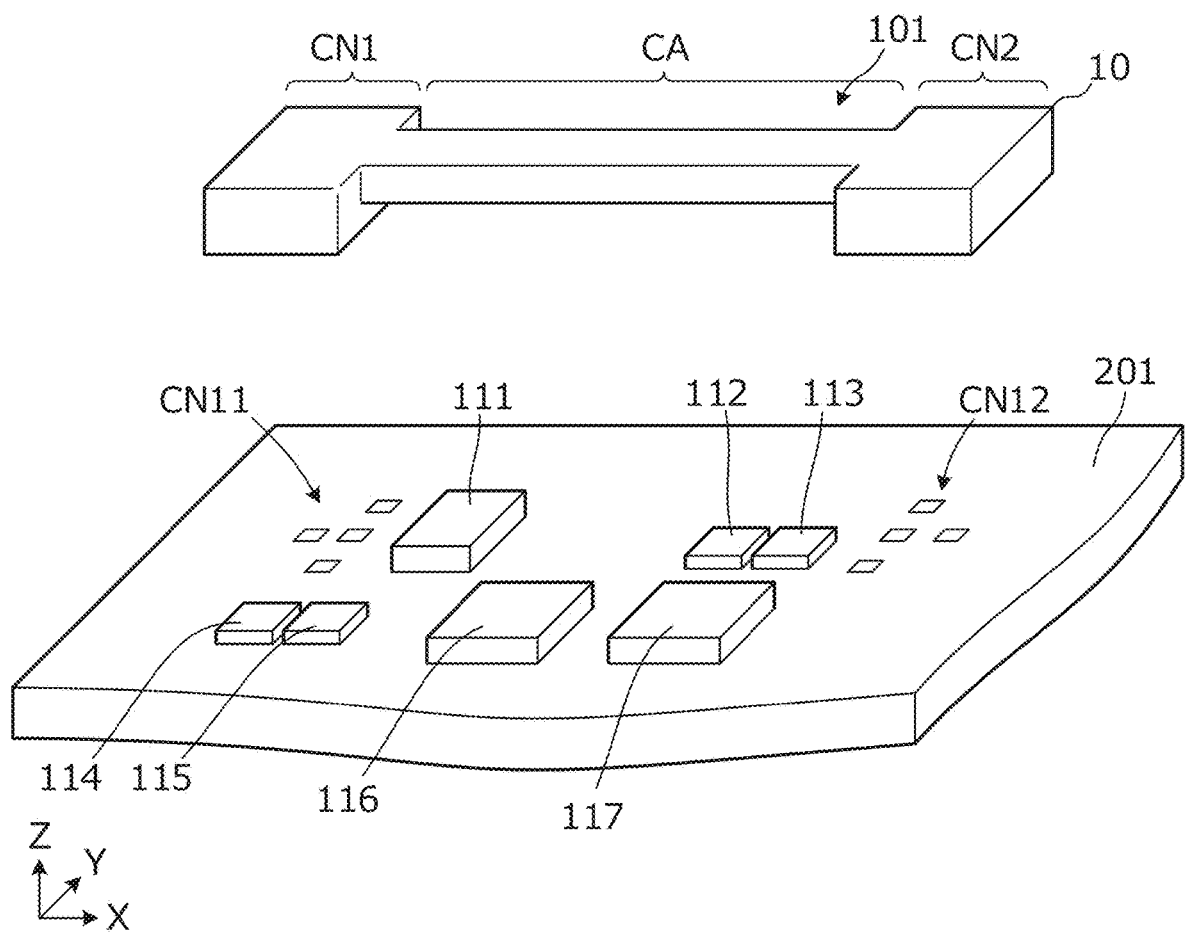
FIG. 2 is an exploded perspective view of the main portion of the electronic device.

FIG. 1 is a perspective view of a main portion of an electronic device 301 according to a first preferred embodiment of the present invention. FIG. 2 is an exploded perspective view of the main portion of the electronic device 301. An electric element 101 of the present preferred embodiment defines and functions as a flat cable including a transmission line.

As shown in FIG. 1 and FIG. 2, the electronic device 301 of the present preferred embodiment includes a circuit board 201, the electric element 101, and electronic components 111 to 117. The electric element 101 and the electronic components 111 to 117 are mounted on the circuit board 201. The electric element 101 includes a multilayer body 10 of a plurality of electrically insulating base materials, a transmission line portion CA provided in the multilayer body 10, a first connection portion CN1 that connects with a first portion of the transmission line portion CA, and a second connection portion CN2 that connects with a second portion of the transmission line portion CA.

The X-axis direction in FIG. 1 and FIG. 2 is a longitudinal direction of the electric element 101. The first connection portion CN1 and the second connection portion CN2 are respectively provided at both ends in the longitudinal direction.

As shown in FIG. 2, circuit board-side connection portions CN11, CN12 are provided on the circuit board 201. The first connection portion CN1 and second connection portion CN2 of the electric element 101 are respectively connected to the circuit board-side connection portions CN11, CN12.

As shown in FIG. 1, in a state where the electric element 101 is mounted on the circuit board 201, the electronic components 111, 112, 113 are disposed between the transmission line portion CA of the electric element 101 and the circuit board 201. That is, the electric element 101 is disposed so as to straddle the electronic components 111, 112, 113 on the circuit board 201. In this example, the electric element 101 contacts with the electronic component 111, and does not contact with the electronic components 112, 113. However, the electric element 101 is not electrically connected to the electronic components 111, 112, 113.

The electrically insulating base materials of the electric element 101 are lower in permittivity than an electrically insulating portion of the circuit board 201. For example, the relative permittivity of the electrically insulating portion of the circuit board 201 is about four; whereas the relative permittivity of the electrically insulating base materials of the electric element 101 is about three.

Figure 3:
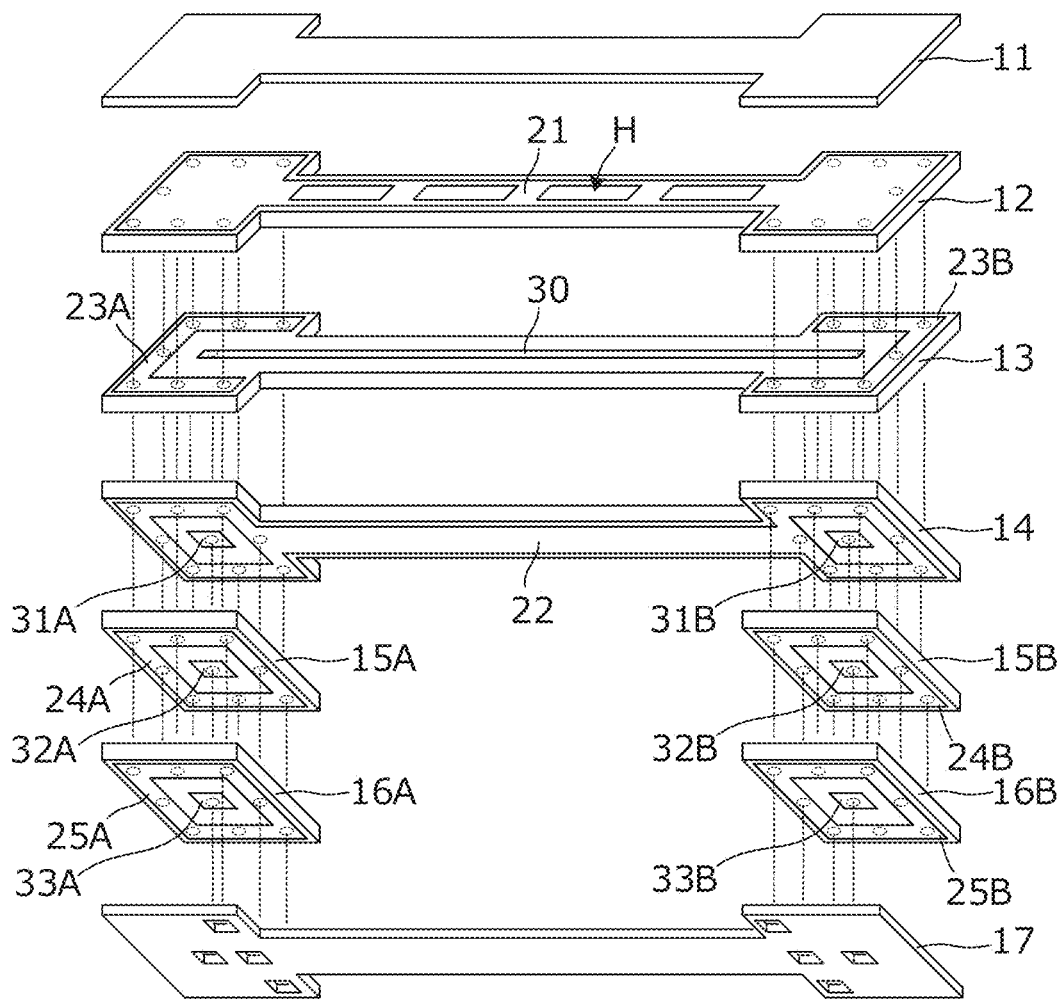
FIG. 3 is an exploded perspective view showing electrically insulating base materials of an electric element and various conductor patterns respectively provided on the electrically insulating base materials.

FIG. 3 is an exploded perspective view showing the electrically insulating base materials of the electric element 101 and various conductor patterns respectively provided on the electrically insulating base materials. The multilayer body 10 in FIG. 2 is a multilayer body including the electrically insulating base materials 11 to 14, 15A, 15B, 16A, 16B, 17 shown in FIG. 3, and is a flexible base material that elastically deforms or plastically deforms by external force. The electrically insulating base materials are, for example, liquid crystal polymer sheets. The various conductor patterns are formed by patterning copper foil stuck on each of the liquid crystal polymer sheets by, for example, photolithography.

In FIG. 3, each of the electrically insulating base materials 11, 17 is a protective layer. An upper ground conductor pattern 21 is provided on the top surface of the electrically insulating base material 12. A signal line 30 and ground conductor patterns 23A, 23B are provided on the top surface of the electrically insulating base material 13. A lower ground conductor pattern 22 and signal line connection conductor patterns 31A, 31B are provided on the bottom surface of the electrically insulating base material 14. A signal line connection conductor pattern 32A and a ground conductor pattern 24A are provided on the bottom surface of the electrically insulating base material 15A. A signal line connection conductor pattern 32B and a ground conductor pattern 24B are provided on the bottom surface of the electrically insulating base material 15B. A signal line connection conductor pattern 33A and a ground conductor pattern 25A are provided on the bottom surface of the electrically insulating base material 16A. A signal line connection conductor pattern 33B and a ground conductor pattern 25B are provided on the bottom surface of the electrically insulating base material 16B. The electrically insulating base material 17 includes openings to expose the signal line connection conductor patterns 33A, 33B and openings to partially expose the ground conductor patterns 25A, 25B.

A transmission line having a strip-line structure includes the signal line 30, the upper ground conductor pattern 21, the lower ground conductor pattern 22, and the electrically insulating portions of the electrically insulating base materials 12, 13, 14. The upper ground conductor pattern 21 includes a plurality of openings H.

The upper ground conductor pattern 21, the lower ground conductor pattern 22, and the ground conductor patterns 23A, 24A, 25A are connected to each other by a plurality of inter-layer connection conductors. Similarly, the upper ground conductor pattern 21, the lower ground conductor pattern 22, and the ground conductor patterns 23B, 24B, 25B are connected to each other by a plurality of inter-layer connection conductors. A first end of the signal line 30 is connected to the signal line connection conductor patterns 31A, 32A, 33A by inter-layer connection conductors. Similarly, a second end of the signal line 30 is connected to the signal line connection conductor patterns 31B, 32B, 33B by inter-layer connection conductors. These inter-layer connection conductors are formed as follows. The inside of a through-hole formed in the electrically insulating base material is filled with conductive paste, and then the conductive paste is solidified as a result of lamination hot press of the plurality of electrically insulating base materials. In FIG. 3, circular portions indicated by the dashed lines represent the inter-layer connection conductors. The dashed lines extending in a vertical direction represent connection relationships of these inter-layer connection conductors. In this way, both ends of the signal line 30 are surrounded by a large number of the inter-layer connection conductors, so high shielding performance for the first connection portion CN1 and the second connection portion CN2 is ensured.

Figure 4:
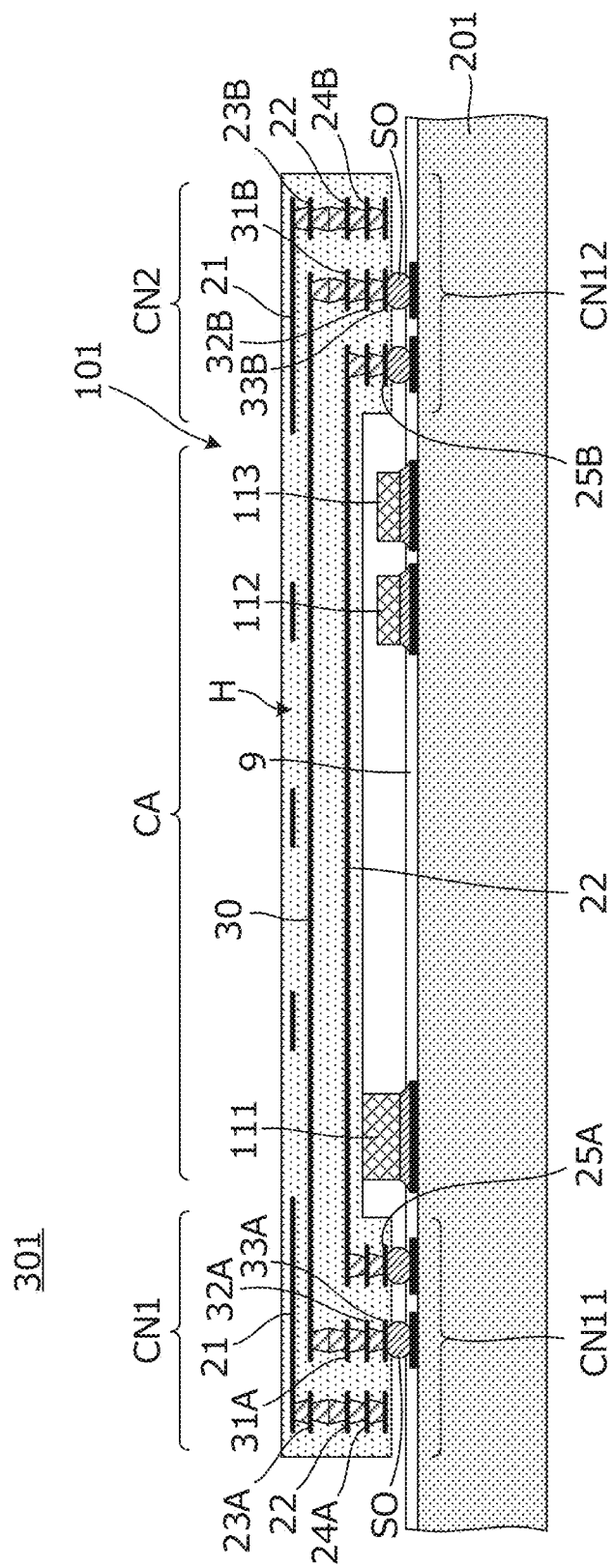
FIG. 4 is a cross-sectional view taken along a plane passing through a portion where the electric element is mounted on a circuit board.

FIG. 4 is a cross-sectional view taken along a plane passing through a portion where the electric element 101 is mounted on the circuit board 201. The signal line connection conductor pattern 33A and the ground conductor pattern 25A provided at the first connection portion CN1 of the electric element 101 are respectively connected via solder SO to pad electrodes provided at the circuit board-side first connection portion CN11 of the circuit board 201. Similarly, the signal line connection conductor pattern 33B and the ground conductor pattern 25B provided at the second connection portion CN2 of the electric element 101 are respectively connected via solder SO to pad electrodes provided at the circuit board-side second connection portion CN12 of the circuit board 201.

The electric element 101, as well as the other electronic components 111 to 117, is picked up with a vacuum suction head, placed on the circuit board 201, and then surface-mounted on the circuit board 201 in subsequent reflow soldering.

The solder SO is precoated solder or solder balls before mounting. For example, a solder bump is provided at each of the openings in the electrically insulating base material 17 shown in FIG. 3, thus defining each of connection portions as a ball grid array (BGA)-type connection portion. When connection is performed by using solder bumps in this way, a high stand-off of, for example, about 150 µm is ensured by the size of solder balls and the size of openings in the electrically insulating base material 17, so the connection strength of the connection portions is easily maintained. Therefore, even when the distance between the first connection portion CN1 and the second connection portion CN2 increases, predetermined connection strength of the electric element 101 to the circuit board 201 is obtained.

FIG. 1 and FIG. 4 show the example in which the single electric element 101 is mounted on the circuit board 201. Instead, another electric element having a similar configuration to that of the electric element 101 may lie on the electric element 101. That is, a plurality of electric elements may be disposed in a stack structure. Those electric elements may intersect with each other in plan view or may be disposed one above the other over a predetermined dimension. With these configurations, thin space along the circuit board surface is effectively used.

In the example shown in FIG. 3 and FIG. 4, the ground conductor patterns respectively provided on the electrically insulating base materials are connected to each other via the inter-layer connection conductors at the first connection portion CN1 and at the second connection portion CN2. The upper ground conductor pattern 21 and the lower ground conductor pattern 22 may also be connected to each other via inter-layer connection conductors.

Figure 5:
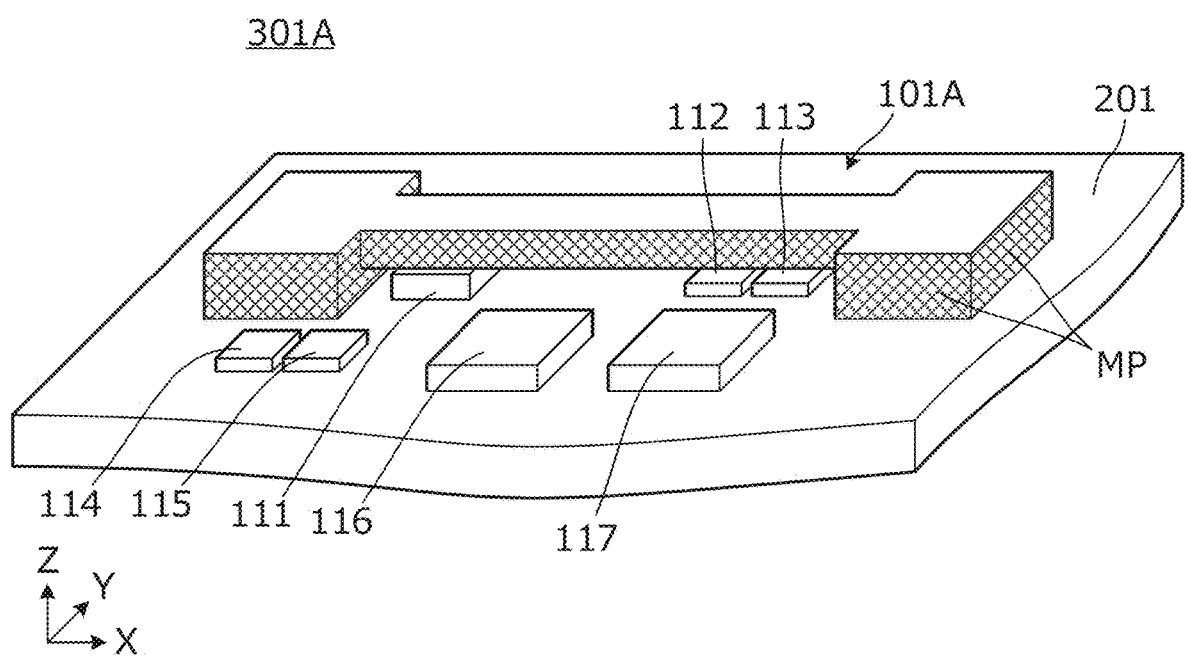
FIG. 5 is an exploded perspective view of a main portion of another electronic device according to the first preferred embodiment of the present invention.

FIG. 5 is a perspective view of a main portion of another electronic device 301A according to the first preferred embodiment. In this electronic device 301A, an electric element 101A is mounted on the circuit board 201. The electric element 101A includes a metal plating film MP provided all over the side surfaces of the electric element 101 shown in FIG. 1 to FIG. 4.

In this way, when the metal plating film MP is provided all over the side surfaces of the electric element 101, shielding performance for the signal line 30 of the electric element 101 improves.

Another component that the transmission line portion of the electric element 101 straddles on the circuit board 201 is preferably not a component having the highest profile among the plurality of components mounted on the circuit board 201. For this reason, the transmission line portion straddling the component does not become extremely high, so effective use of space is achieved.

Some main advantageous effects of the present preferred embodiment are as follows.

Since the electronic components 111, 112, 113 are disposed between the transmission line portion CA and the circuit board 201, a region under the transmission line portion CA is also effectively used. This reduces the substantial footprint of the electric element 101.

The lower ground conductor pattern 22 is interposed between the signal line 30 and the electronic components 111, 112, 113, so EMI between the transmission line portion CA and each of the electronic components 111, 112, 113 is avoided. Particularly, since the width of the electric element 101 does not need to be narrowed, the width of the lower ground conductor pattern 22 is ensured, so shielding effectiveness of the lower ground conductor pattern 22 is high. In addition, as described above, even when electric elements intersect with each other, the width of each electric element does not need to be narrowed, so EMI between the electric elements is reduced by the ground conductor patterns respectively provided on the electric elements.

Particularly, in a transmission line for which it is important to take measures against electromagnetic compatibility (EMC) over a wide band, for example, a transmission line used for Wireless Gigabit (WiGig) that is one of short-distance high-speed digital wireless transmission protocol, it is effective to ensure the width of the ground conductor pattern.

The electrically insulating base materials of the electric element 101 are lower in permittivity than the electrically insulating portion of the circuit board 201. Therefore, the width and thickness of the signal line of the transmission line portion CA are greater than those of a transmission line defined by the conductor pattern at the circuit board 201 and having the same characteristic impedance as that of the transmission line portion CA, so a conductor loss is reduced. In addition, a dielectric loss is also reduced. Furthermore, since the gap between the signal line and a ground conductor pattern is narrowed, an entirety of the electric element 101 has a low profile.

Since the plurality of openings H is formed in the upper ground conductor pattern 21, a capacitance that is generated between the upper ground conductor pattern 21 and the signal line 30 reduces. Accordingly, the distance between the upper ground conductor pattern 21 and the signal line 30 is reduced, so the thickness of the transmission line portion CA of the electric element 101 is reduced. This also allows space under the transmission line portion CA to be easily ensured.

Since the upper ground conductor pattern 21 is provided, shielding performance above the top surface of the electric element 101 is also ensured. Therefore, even when another electric element or another electronic component is disposed on or above the electric element 101, EMI between the electric element 101 and such an electric element or electronic component is also reduced. When the thickness of the electric element is intended to be reduced, it is effective to form an opening in the upper ground conductor pattern. When shielding performance against an electric element or another electronic component, disposed on or above the electric element 101, is ensured, the opening may be omitted.

Since the electric element includes a flexible board, even when a portion (spaced-apart portion) spaced apart from the circuit board receives stress as a result of contact with another electric element, fracture of the spaced-apart portion or induction of bonding failure due to application of stress to the bonding portion is reduced. Furthermore, an electric element is allowed to be disposed so as to lie on another component or member, so space saving is achieved.

Second Preferred Embodiment

In a second preferred embodiment of the present invention, an example of an electronic device including an electric element including three connection portions will be described.

Figure 6:
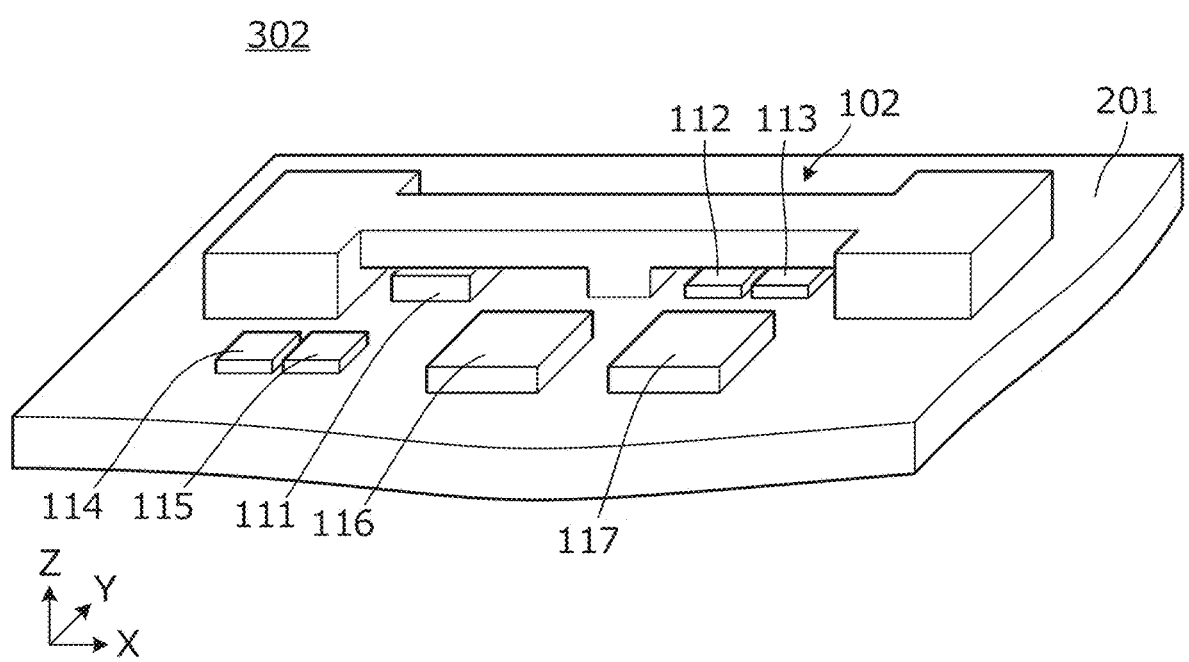
FIG. 6 is a perspective view of a main portion of an electronic device according to a second preferred embodiment of the present invention.
Figure 7:
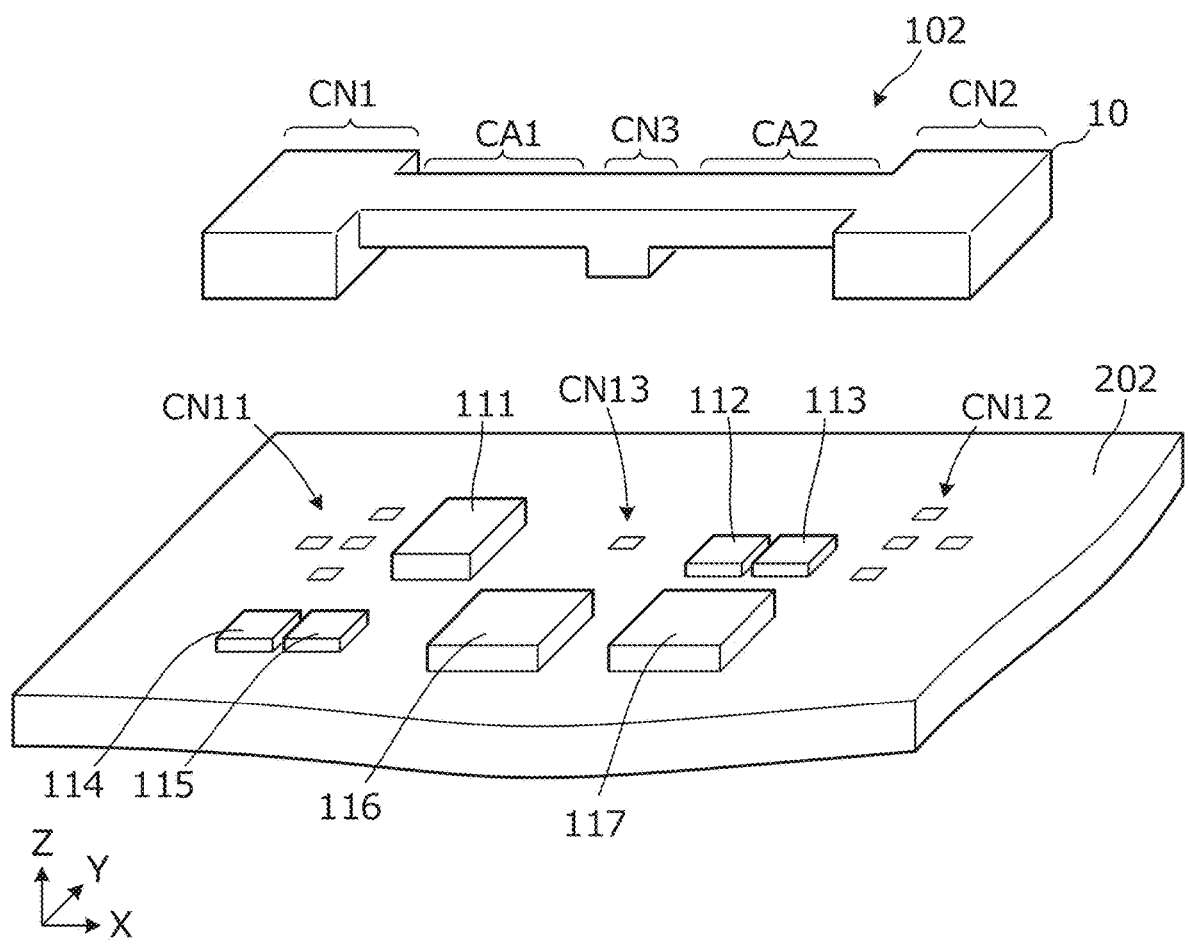
FIG. 7 is an exploded perspective view of the main portion of the electronic device.

FIG. 6 is a perspective view of a main portion of an electronic device 302 according to the second preferred embodiment. FIG. 7 is an exploded perspective view of the main portion of the electronic device 302. An electric element 102 of the present preferred embodiment defines and functions as a flat cable including a transmission line.

The electronic device 302 differs from the electronic device 301 shown in FIG. 1 and FIG. 2 in that the electric element 102 includes a third connection portion CN3 and a circuit board-side third connection portion CN13 is provided on a circuit board 202. That is, the electric element 102 includes the transmission line portion CA1, a transmission line portion CA2, and the connection portions CN1, CN2, CN3. The first connection portion CN1 and the second connection portion CN2 are respectively provided at both ends in the longitudinal direction (X-axis direction in FIG. 6 and FIG. 7). The third connection portion CN3 is provided between the first connection portion CN1 and the second connection portion CN2 in the longitudinal direction.

Figure 8:
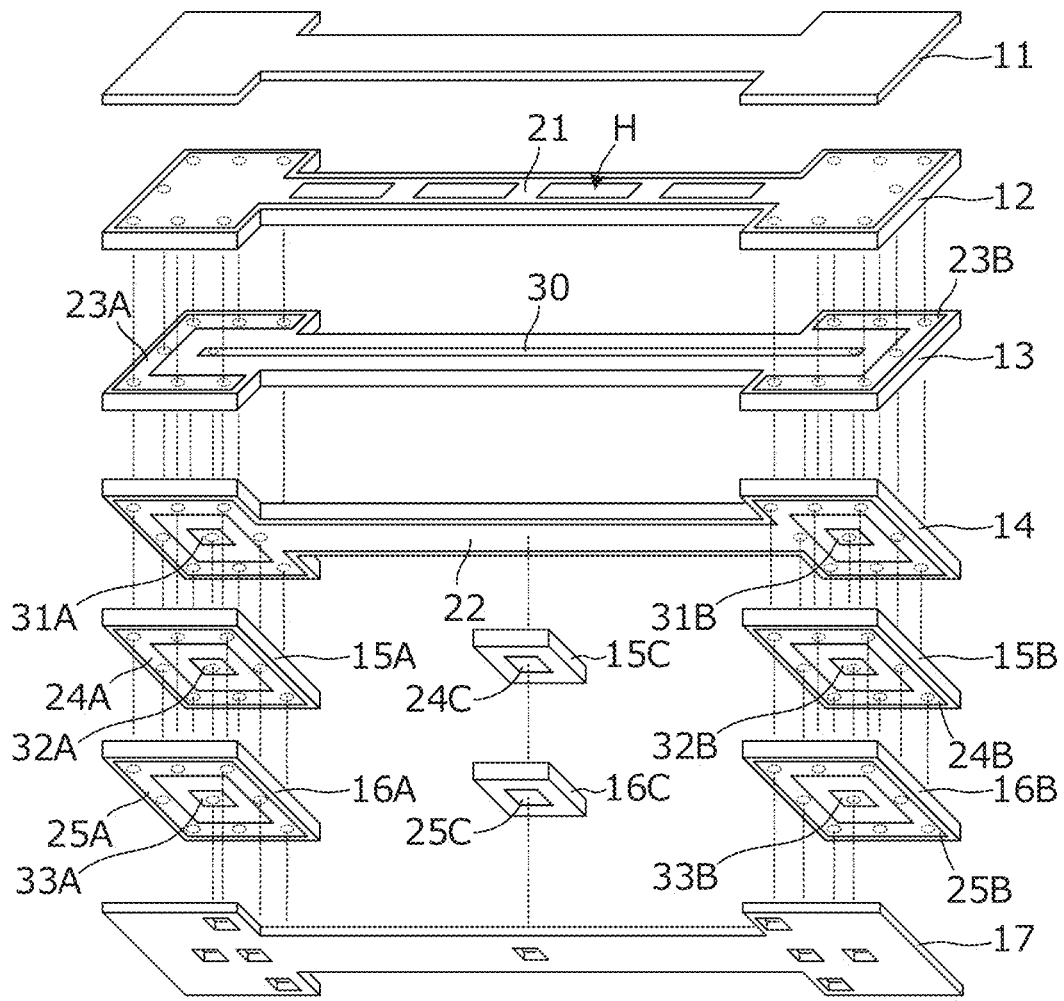
FIG. 8 is an exploded perspective view showing electrically insulating base materials of an electric element and various conductor patterns respectively provided on the electrically insulating base materials.

FIG. 8 is an exploded perspective view showing electrically insulating base materials of the electric element 102 and various conductor patterns respectively provided on the electrically insulating base materials. The electric element 102 differs from the electric element 101 shown in FIG. 3 in that the electric element 102 includes electrically insulating base materials 15C, 16C. A ground conductor pattern 24C and an inter-layer connection conductor are provided at the electrically insulating base material 15C, and a ground conductor pattern 25C and an inter-layer connection conductor are provided at the electrically insulating base material 16C. The ground conductor patterns 24C, 25C are electrically continuous with the lower ground conductor pattern 22 via those inter-layer connection conductors. In this example, the electrically insulating base material 15C is separated from the electrically insulating base materials 15A, 15B, and the electrically insulating base material 16C is separated from the electrically insulating base materials 16A, 16B. Instead, the electric element 102 having the shape shown in FIG. 7 may be formed by removing unnecessary portions after lamination hot pressing.

Figure 9:
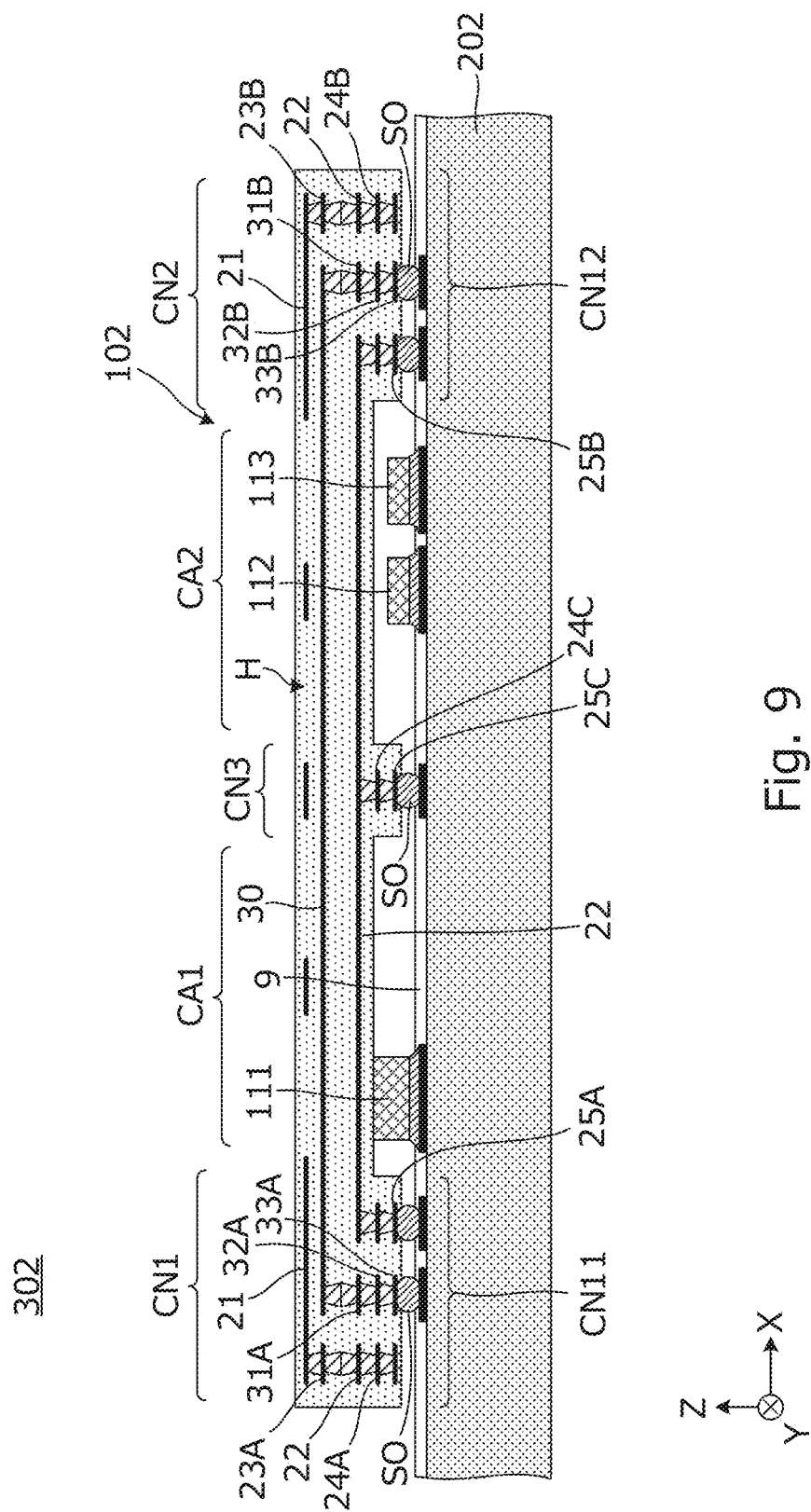
FIG. 9 is a cross-sectional view taken along a plane passing through a portion where the electric element is mounted on a circuit board.

FIG. 9 is a cross-sectional view taken along a plane passing through a portion where the electric element 102 is mounted on the circuit board 202. The signal line connection conductor pattern 33A and ground conductor pattern 25A provided at the first connection portion CN1 of the electric element 102 are respectively connected via solder SO to pad electrodes provided at the circuit board-side first connection portion CN11 of the circuit board 202. The signal line connection conductor pattern 33B and ground conductor pattern 25B provided at the second connection portion CN2 of the electric element 102 are respectively connected via solder SO to pad electrodes provided at the circuit board-side second connection portion CN12 of the circuit board 202. Furthermore, the ground conductor pattern 25C provided at the third connection portion CN3 of the electric element 102 is connected via solder SO to a pad electrode provided at the circuit board-side third connection portion CN13 of the circuit board 202.

Some main advantageous effects of the present preferred embodiment are as follows.

With the structure that the three portions of the electric element 102 are connected to the circuit board 202, even when the distance from the first connection portion CN1 to the second connection portion CN2 is long, the mechanical strength of the electric element 102 on the circuit board 202 is ensured. Particularly, even when the electric element 102 has flexibility, a mounting misalignment on the circuit board 202 is reduced.

Since the ground conductor of the transmission line is connected to the ground of the circuit board at the third connection portion CN3 between the first connection portion CN1 and the second connection portion CN2, the ground potential of the transmission line is stabilized, so EMI of the transmission line is further reduced.

Third Preferred Embodiment

In a third preferred embodiment of the present invention, an example of an electronic device including an electric element including a plurality of transmission lines will be described.

Figure 10:
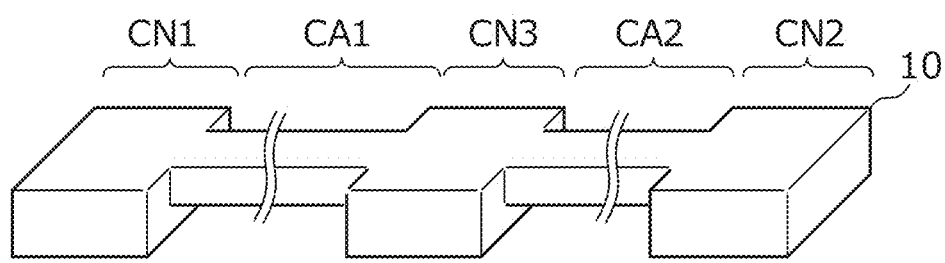
FIG. 10 is a perspective view of an electric element according to a third preferred embodiment of the present invention.
Figure 11:
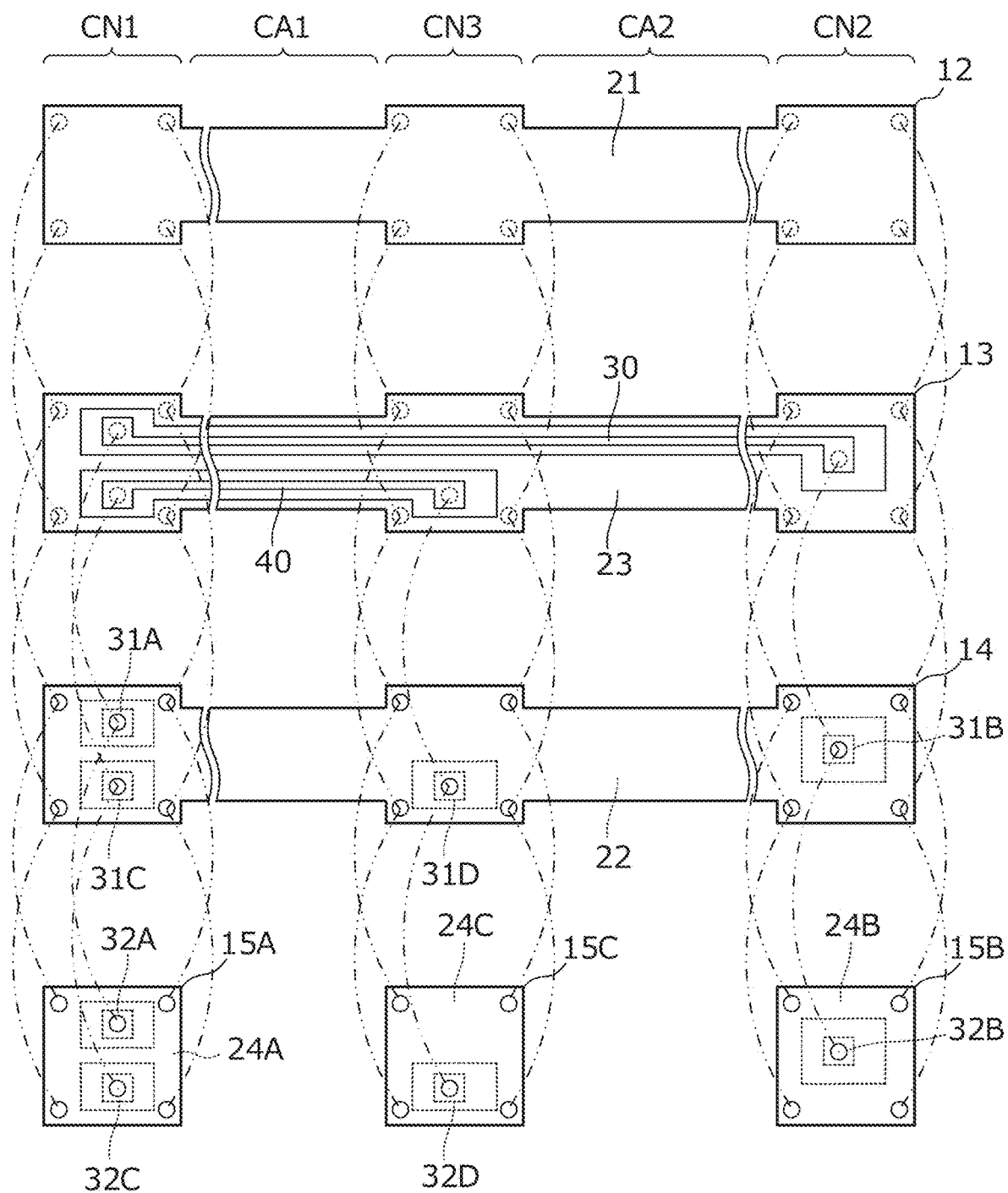
FIG. 11 is an exploded plan view of the electric element.

FIG. 10 is a perspective view of an electric element 103 according to a third preferred embodiment of the present invention. FIG. 11 is an exploded plan view of the electric element 103. The electric element 103 includes the multilayer body 10 of the plurality of electrically insulating base materials, the transmission line portions CA1, CA2, and the connection portions CN1, CN2, CN3. The transmission line portions CA1, CA2 and the connection portions CN1, CN2, CN3 are provided in the multilayer body 10. The connection portions CN1, CN3 are respectively continuous with both ends of the transmission line portion CA1. The connection portions CN3, CN2 are respectively continuous with both ends of the transmission line portion CA2.

In FIG. 11, the upper ground conductor pattern 21 is provided all over the top surface of the electrically insulating base material 12, the signal line 30, a signal line 40, and a ground conductor pattern 23 are provided on the top surface of the electrically insulating base material 13, and the lower ground conductor pattern 22 is provided on the bottom surface of the electrically insulating base material 14.

The signal line connection conductor patterns 31A, 31B and signal line connection conductor patterns 31C, 31D are provided on the bottom surface of the electrically insulating base material 14. The signal line connection conductor pattern 31A is connected to the first end of the signal line 30 via the inter-layer connection conductor, and the signal line connection conductor pattern 31B is connected to the second end of the signal line 30 via the inter-layer connection conductor. The signal line connection conductor pattern 31C is connected to a first end of the signal line 40 via an inter-layer connection conductor, and the signal line connection conductor pattern 31D is connected to a second end of the signal line 40 via an inter-layer connection conductor.

The signal line connection conductor pattern 32A, a signal line connection conductor pattern 32C, and the ground conductor pattern 24A are provided on the bottom surface of the electrically insulating base material 15A, and the signal line connection conductor pattern 32B and the ground conductor pattern 24B are provided on the bottom surface of the electrically insulating base material 15B. In addition, a signal line connection conductor pattern 32D and a ground conductor pattern 24C are provided on the bottom surface of the electrically insulating base material 15C.

The upper ground conductor pattern 21 and the ground conductor pattern 23 provided on the electrically insulating base material 13 are connected to each other via inter-layer connection conductors. The lower ground conductor pattern 22 and the ground conductor pattern 23 provided on the electrically insulating base material 13 are connected to each other via inter-layer connection conductors. Furthermore, the lower ground conductor pattern 22 and the ground conductor patterns 24A, 24B, 24C respectively provided on the electrically insulating base materials 15A, 15B, 15C are connected to each other via inter-layer connection conductors. In FIG. 11, circular portions indicated by the dashed lines or the solid lines represent the inter-layer connection conductors. The alternate long and two-short dashed lines represent connection relationships made by these inter-layer connection conductors.

A first transmission line having a strip-line structure includes the signal line 30, the upper ground conductor pattern 21, the lower ground conductor pattern 22, the ground conductor pattern 23, and the electrically insulating portions of the electrically insulating base materials 12, 13, 14. A second transmission line having a strip-line structure includes the signal line 40, the upper ground conductor pattern 21, the lower ground conductor pattern 22, the ground conductor pattern 23, and the electrically insulating portions of the electrically insulating base materials 12, 13, 14.

In the present preferred embodiment, the portion between the first connection portion CN1 and the second connection portion CN2 is used as the first transmission line, and the portion between the first connection portion CN1 and the third connection portion CN3 is used as the second transmission line. Particularly, the ground conductor pattern 23 is located between the signal line 30 and the signal line 40 in the plane direction, the lower ground conductor pattern 22 is located between the signal line connection conductor pattern 31A and the signal line connection conductor pattern 31C, and, in addition, the ground conductor pattern 24A is located between the signal line connection conductor pattern 32A and the signal line connection conductor pattern 32C. Therefore, shielding performance between the signal line 30 and the signal line 40 is ensured.

The electric element 103 is mounted on a circuit board as in the case of the first and second preferred embodiments. In the mounted state, space is provided between the first transmission line portion CA1 and the circuit board, and space is provided between the second transmission line portion CA2 and the circuit board. Electronic components can be disposed in these spaces.

According to the present preferred embodiment, the electric element 103 can be handled as a single component including the first transmission line continuous between the first connection portion CN1 and the second connection portion CN2 and the second transmission line continuous between the first connection portion CN1 and the third connection portion CN3.

Fourth Preferred Embodiment

In a fourth preferred embodiment of the present invention, an electronic device including an electric element that is used as a power splitter or a multiplexer-demultiplexer will be described.

Figure 12:
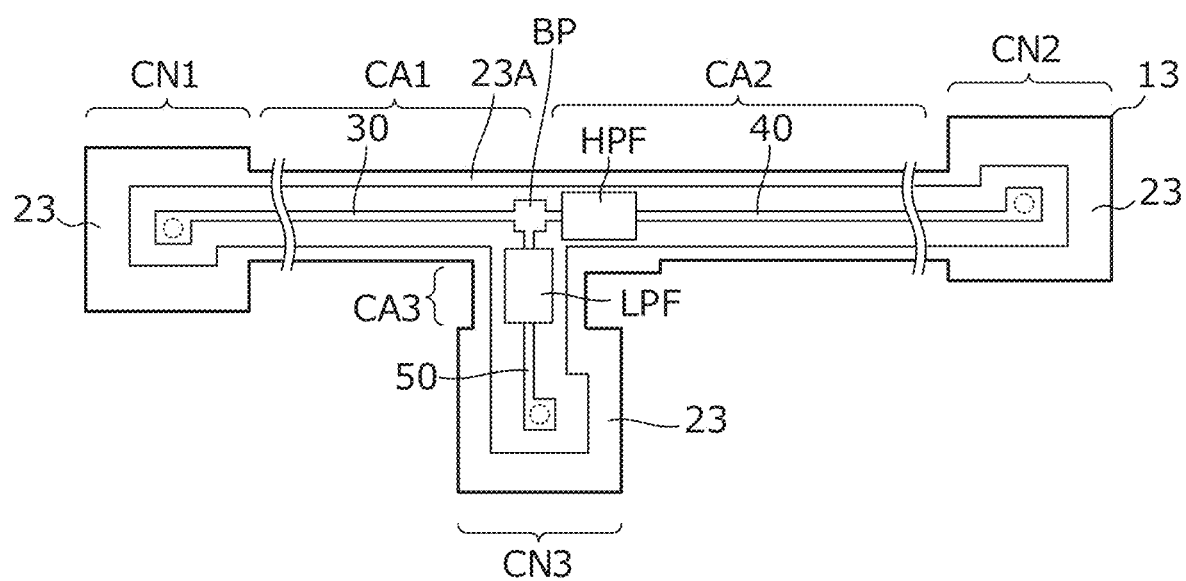
FIG. 12 is a plan view of an electrically insulating base material, on which signal lines are provided, of an electric element according to a fourth preferred embodiment of the present invention.

FIG. 12 is a plan view of the electrically insulating base material 13, on which signal lines are provided, of the electric element of the present preferred embodiment. The signal lines 30, 40, a signal line 50, and the ground conductor pattern 23 are provided on the top surface of the electrically insulating base material 13. The signal line 30, the signal line 40, and the signal line 50 are connected at a branching point BP. On the assumption that the plurality of signal lines is one continuous signal line, a first end of the signal line is provided at the first connection portion CN1, a second end of the signal line is provided at the second connection portion CN2, and a third end of the signal line is provided at the third connection portion CN3.

FIG. 12 shows only the electrically insulating base material 13 on which the signal line is provided. However, as in the case of the preferred embodiments described above, an electrically insulating base material on which an upper ground conductor pattern is provided is disposed in a layer above the electrically insulating base material 13, and an electrically insulating base material on which a lower ground conductor pattern is provided is disposed in a layer below the electrically insulating base material 13.

A first transmission line having a strip-line structure includes the signal line 30, the upper ground conductor pattern, the lower ground conductor pattern, and the electrically insulating portions of the electrically insulating base materials between the upper ground conductor pattern and the lower ground conductor pattern. A second transmission line having a strip-line structure includes the signal line 40, the upper ground conductor pattern, the lower ground conductor pattern, and the electrically insulating portions of the electrically insulating base materials between the upper ground conductor pattern and the lower ground conductor pattern. Similarly, a third transmission line having a strip-line structure includes the signal line 50, the upper ground conductor pattern, the lower ground conductor pattern, and the electrically insulating portions of the electrically insulating base materials between the upper ground conductor pattern and the lower ground conductor pattern.

A high-pass filter HPF is inserted in the second transmission line near the branching point BP. A low-pass filter LPF is inserted in the third transmission line near the branching point BP.

According to the present preferred embodiment, the electric element may be used as a multiplexer-demultiplexer including the first connection portion CN1 as a common port, the second connection portion CN2 as a high-band port, and the third connection portion CN3 as a low-band port.

A power splitter may be configured similarly when impedance matching circuits are provided near the branching point BP instead of the radio-frequency filters.

Fifth Preferred Embodiment

In a fifth preferred embodiment of the present invention, an example of an electronic device including an electric element having a bent shape so as to be routed around an electronic component will be described.

Figure 13A:
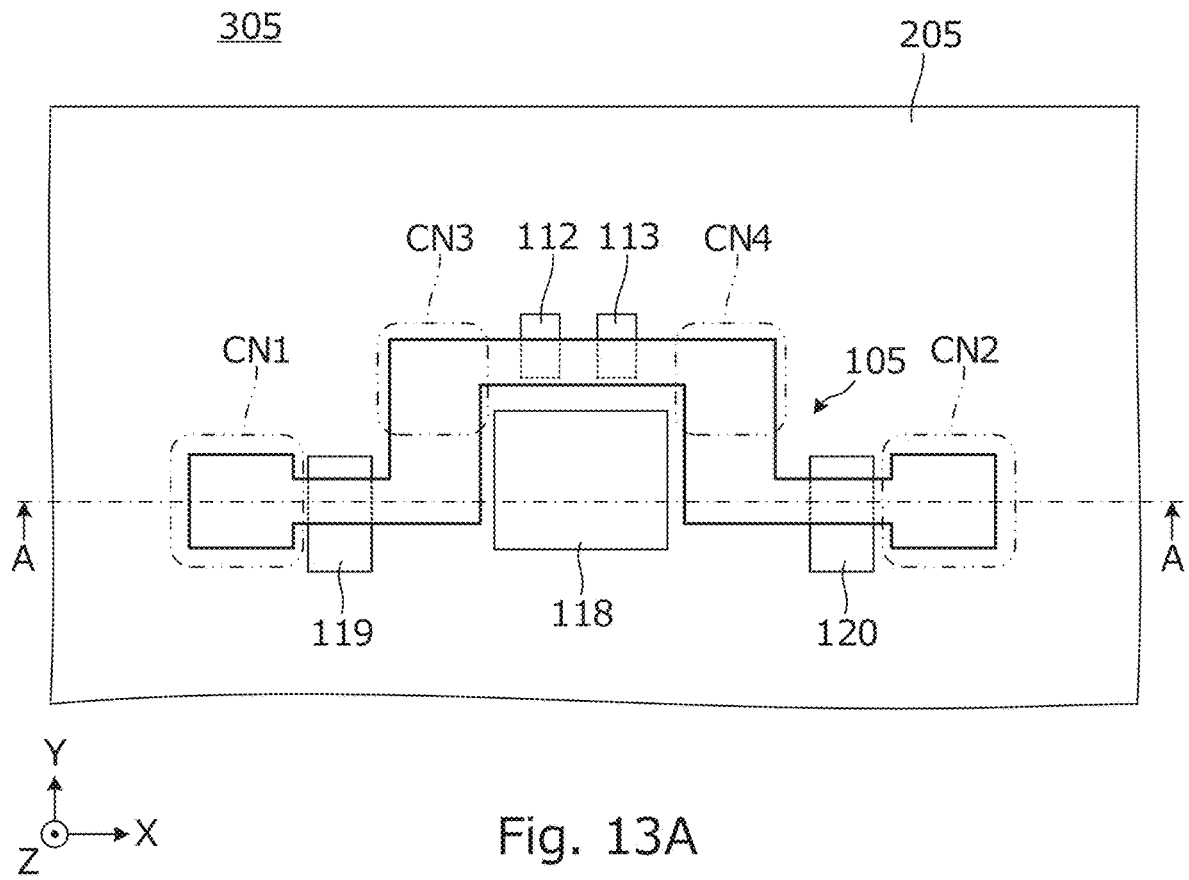
FIG. 13A is a plan view of a main portion of an electronic device of the fourth preferred embodiment of the present invention.
Figure 13B:
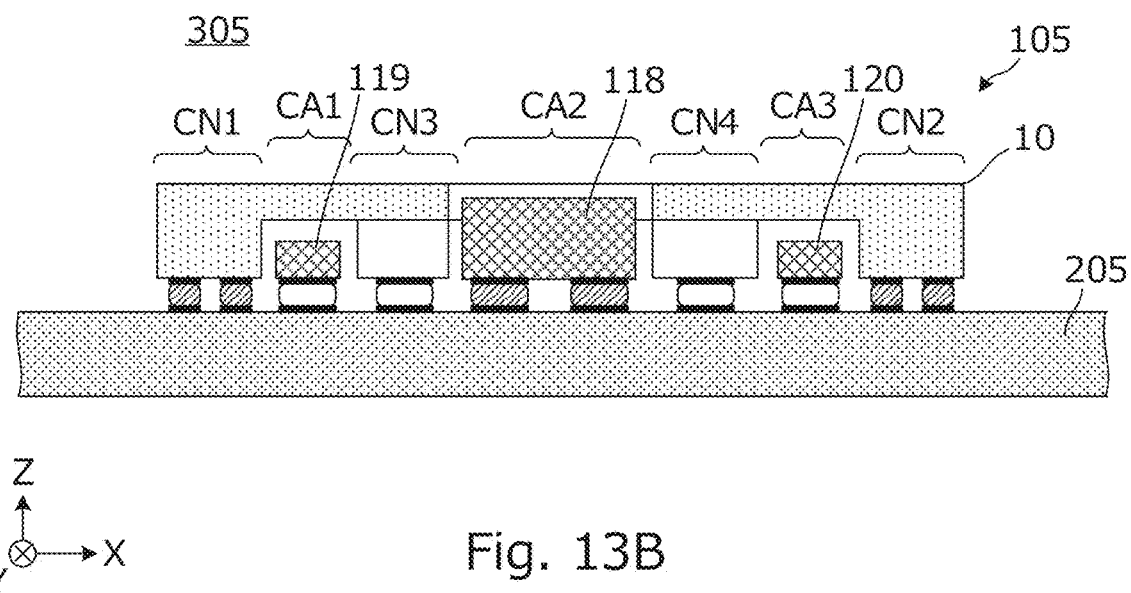
FIG. 13B is a cross-sectional view taken along the line A-A in FIG. 13A.

FIG. 13A is a plan view of a main portion of an electronic device 305 of the present preferred embodiment. FIG. 13B is a cross-sectional view taken along the line A-A in FIG. 13A. Conductor patterns in an electric element 105 are not shown.

The electronic device 305 includes a circuit board 205, the electric element 105, and electronic components 112, 113, 119, 120, and the like. The electric element 105 and the electronic components 112, 113, 119, 120 are mounted on the circuit board 205. The electric element 105 includes the multilayer body 10 of the plurality of electrically insulating base materials, the transmission line portions CA1, CA2, CA3, the connection portions CN1, CN2, CN3, and a connection portion CN4. The transmission line portions CA1, CA2, CA3 and the connection portions CN1, CN2, CN3, CN4 are provided in the multilayer body 10.

In this example, the connection portions CN3, CN4 are disposed at the bent portions in plan view of the multilayer body 10. Instead, the connection portions CN3, CN4 may be disposed all over portions extending in the Y-axis direction.

The electric element 105 has a bent shape in plan view of the circuit board 205 so as to be routed around an electronic component 118. With this structure, even when the electronic component 118 having a relatively high profile is located close to the electric element 105 and no sufficient space is ensured in the height direction between the transmission line portion CA2 of the electric element 105 and the circuit board 205, the electric element 105 can be mounted on the circuit board 205 around the electronic component 118 having a high profile.

The electric element may have a curved shape in plan view of the circuit board so as to be routed around an electronic component on the circuit board.

Other Preferred Embodiments

In the above-described preferred embodiments, the examples of the strip-line transmission line are described. The configurations of the above-described preferred embodiments are similarly applicable to transmission lines of other types, such as micro strip line, coplanar line, and slot line.

In the above-described preferred embodiments, the example in which the openings H are provided in the upper ground conductor pattern is described; however, the openings H are not indispensable. An opening may be formed in the lower ground conductor pattern.

In the above-described preferred embodiments, the electric element preferably includes a multilayer body that is shaped in a line as a whole. Instead, the multilayer body may have any shape, such as an L-shape, a U-shape, and a crank shape.

In the above-described preferred embodiments, the example in which the first connection portion CN1 and the second connection portion CN2 are respectively provided at both ends of the multilayer body is described; however, of the plurality of connection portions, two connection portions do not always need to be respectively provided at both ends.

In the above-described preferred embodiments, the example in which the electric element is mounted on the single circuit board is described. Instead, the connection portions of the electric element may be connected to a plurality of separated circuit boards.

In the above-described preferred embodiments, the example in which the electric element is mounted on the flat circuit board is described. Instead, the configurations of the preferred embodiments are similarly applicable to a structure that the electric element is mounted at a location having a step, or a curved surface.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic device comprising:
a circuit board including a main surface;
an electronic component mounted on the main surface of the circuit board; and
an electric element surface-mounted on the main surface of the circuit board; wherein
the electric element includes:
 a multilayer body including a plurality of laminated electrically insulating base materials that are a same material;
 a transmission line portion in the multilayer body; and
 a plurality of connection portions in the multilayer body and each continuous with a corresponding one of a plurality of portions of the transmission line portion;

the multilayer body includes first portions and a second portion, and a number of the laminated electrically insulating base materials at each of the first portions is greater than a number of the laminated electrically insulating base materials at the second portion;
the first portions are projecting portions, and the second portion is a recessed portion;
each of the plurality of connection portions is provided at a corresponding one of the projecting portions;
each of the plurality of connection portions is connected to the circuit board by an electrically conductive bonding material;
the electric element is surface-mounted on the circuit board such that the recessed portion faces the electronic component;
the plurality of connection portions include a first connection portion, a second connection portion, and a third connection portion;
the transmission line portion includes:
 a first transmission line portion extending between the first connection portion and a branching point;
 a second transmission line portion extending between the second connection portion and the branching point; and
 a third transmission line portion extending between the third connection portion and the branching point; and
the electric element includes:
 a high-pass filter inserted in the second transmission line portion; and
 a low-pass filter inserted in the third transmission line portion.

2. The electronic device according to claim 1, wherein
the electric element has a longitudinal direction; and
the first connection portion and the second connection portion are respectively located at both ends in the longitudinal direction, and the third connection portion is located between the first connection portion and the second connection portion in the longitudinal direction.

3. The electronic device according to claim 1, wherein
the transmission line portion includes a plurality of signal lines including a first signal line and a second signal line;
a first end of the first signal line is provided at the first connection portion;
a second end of the first signal line is provided at the second connection portion;
a first end of the second signal line is provided at the first connection portion; and
a second end of the second signal line is provided at the third connection portion.

4. The electronic device according to claim 3, wherein
the transmission line portion includes a lower ground conductor pattern parallel or substantially parallel to the circuit board; and
the lower ground conductor pattern is located between the signal lines and the electronic component.

5. The electronic device according to claim 4, wherein the transmission line portion includes an upper ground conductor pattern located such that the signal lines are interposed between the upper ground conductor pattern and the lower ground conductor pattern.

6. The electronic device according to claim 5, wherein the upper ground conductor pattern and the lower ground conductor pattern are connected to each other by an inter-layer connection conductor.

7. The electronic device according to claim 6, wherein additional ground conductors are provided and connected to the upper ground conductor pattern and the lower ground conductor pattern by the inter-layer connection conductor.

8. The electronic device according to claim 1, wherein
the transmission line portion includes a signal line including a first end, a second end, and a third end;
the first end of the signal line is provided at the first connection portion;
the second end of the signal line is provided at the second connection portion; and
the third end of the signal line is provided at the third connection portion.

9. The electronic device according to claim 1, wherein in a plan view of the circuit board, the transmission line portion is narrower in width than the plurality of connection portions.

10. The electronic device according to claim 1, wherein in a plan view of the circuit board, the electric element has a curved or bent shape so as to be routed around the electronic component.

11. The electronic device according to claim 1, wherein
the electronic component includes a plurality of electronic components having different profiles; and
of the plurality of electronic components, an electronic component that the recessed portion of the electric element faces is an electronic component other than an electronic component having a highest profile among the plurality of electronic components.

12. The electronic device according to claim 1, wherein
the circuit board includes an electrically insulating portion; and
the laminated electrically insulating base materials are lower in permittivity than the electrically insulating portion of the circuit board.

13. The electronic device according to claim 1, wherein the electric element is a cable including a transmission line.

14. The electronic device according to claim 1, wherein the electronic component includes a plurality of electronic components.

15. The electronic device according to claim 14, wherein the electric element straddles some of the plurality of electronic components but is not electrically connected thereto.

16. The electronic device according to claim 1, wherein the transmission line portion has a strip-line structure.

17. The electronic device according to claim 1, wherein the electric element includes a metal film provided over side surfaces thereof.

18. The electronic device according to claim 1, wherein the electric element is a power splitter or a multiplexer-demultiplexer.

19. The electronic device according to claim 1, wherein the recessed portion does not include an external connection portion that is electrically connected to the electronic component that the recessed portion faces.

* * * * *